United States Patent [19]
Shima

[11] Patent Number: 5,933,033
[45] Date of Patent: Aug. 3, 1999

[54] SIGNAL PROCESSING APPARATUS CAPABLE OF REDUCING CONVERSION ERROR OF A NUMBER OF PARALLEL-ARRANGED SIGNAL CONVERTERS

[75] Inventor: Takeshi Shima, Sagamihara, Japan

[73] Assignee: Kabushiki Kaisha Toshiba, Kawasaki, Japan

[21] Appl. No.: 08/616,457

[22] Filed: Mar. 15, 1996

[30] Foreign Application Priority Data

Mar. 16, 1995 [JP] Japan ................................. 7-057252

[51] Int. Cl.$^6$ .................................................. H03B 21/00
[52] U.S. Cl. ......................................................... 327/105
[58] Field of Search ................................. 327/100, 105, 327/106, 107, 113, 124, 141, 142, 147, 156, 374–377, 91, 94

[56] References Cited

U.S. PATENT DOCUMENTS

| | | | |
|---|---|---|---|
| 4,540,897 | 9/1985 | Takaoka et al. | 327/50 |
| 4,654,597 | 3/1987 | Hino | 327/106 |
| 5,162,745 | 11/1992 | Koken | 327/105 |
| 5,410,195 | 4/1995 | Ichihara | 327/94 |
| 5,463,334 | 10/1995 | Griffin et al. | 327/106 |
| 5,521,533 | 5/1996 | Swanke | 327/107 |

OTHER PUBLICATIONS

R.J. Van De Plassche. "Dynamic Element Matching For High–Accuracy Monolithic D/A Converters", *IEEE Journal of Solid–State Circuits*, vol. SC–11, No. 6, Dec. 1976, pp. 795–800.

*Primary Examiner*—My-Trang Nu Ton
*Attorney, Agent, or Firm*—Oblon, Spivak, McClelland, Maier & Neustadt, P.C.

[57] ABSTRACT

A signal processing apparatus includes a switching unit for switching one input signal to be processed and outputting the switched signal. Signal processing units have the same structure, and each of the signal processing units comprises a plurality of signal processors for subjecting an input signal to be processed to predetermined signal processing. Each signal processor has an inherent signal processing error. A control unit controls a switching operation of the switching unit so that the switched signal output from the switching unit is input to an arbitrary combination of the signal processors. A synthesizing unit synthesizes outputs from the arbitrary combination of signal processors and produces one output signal in which the inherent signal processing error of each signal processor has been averaged.

10 Claims, 12 Drawing Sheets

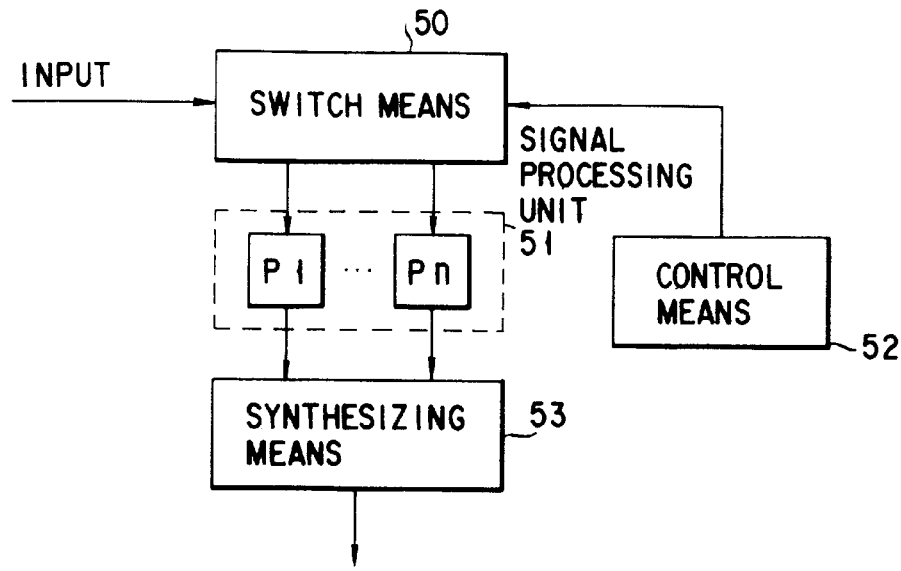
F I G. 1
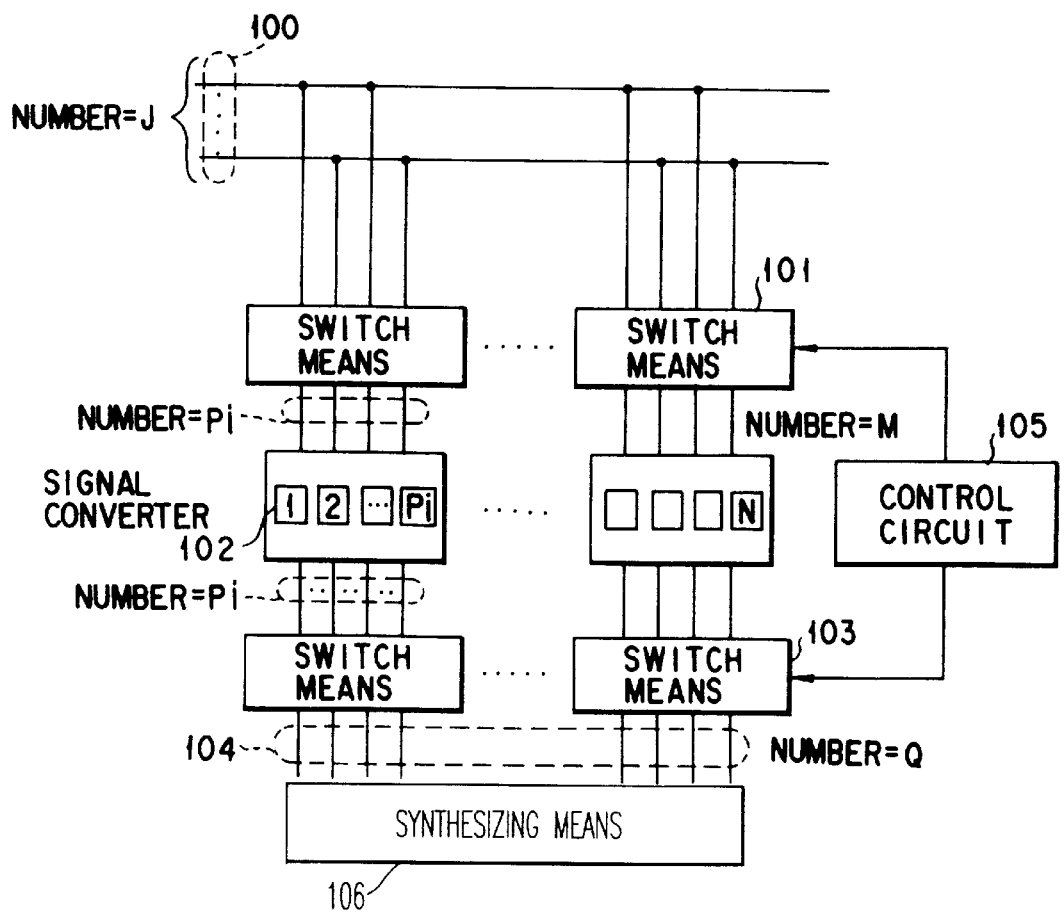
F I G. 2

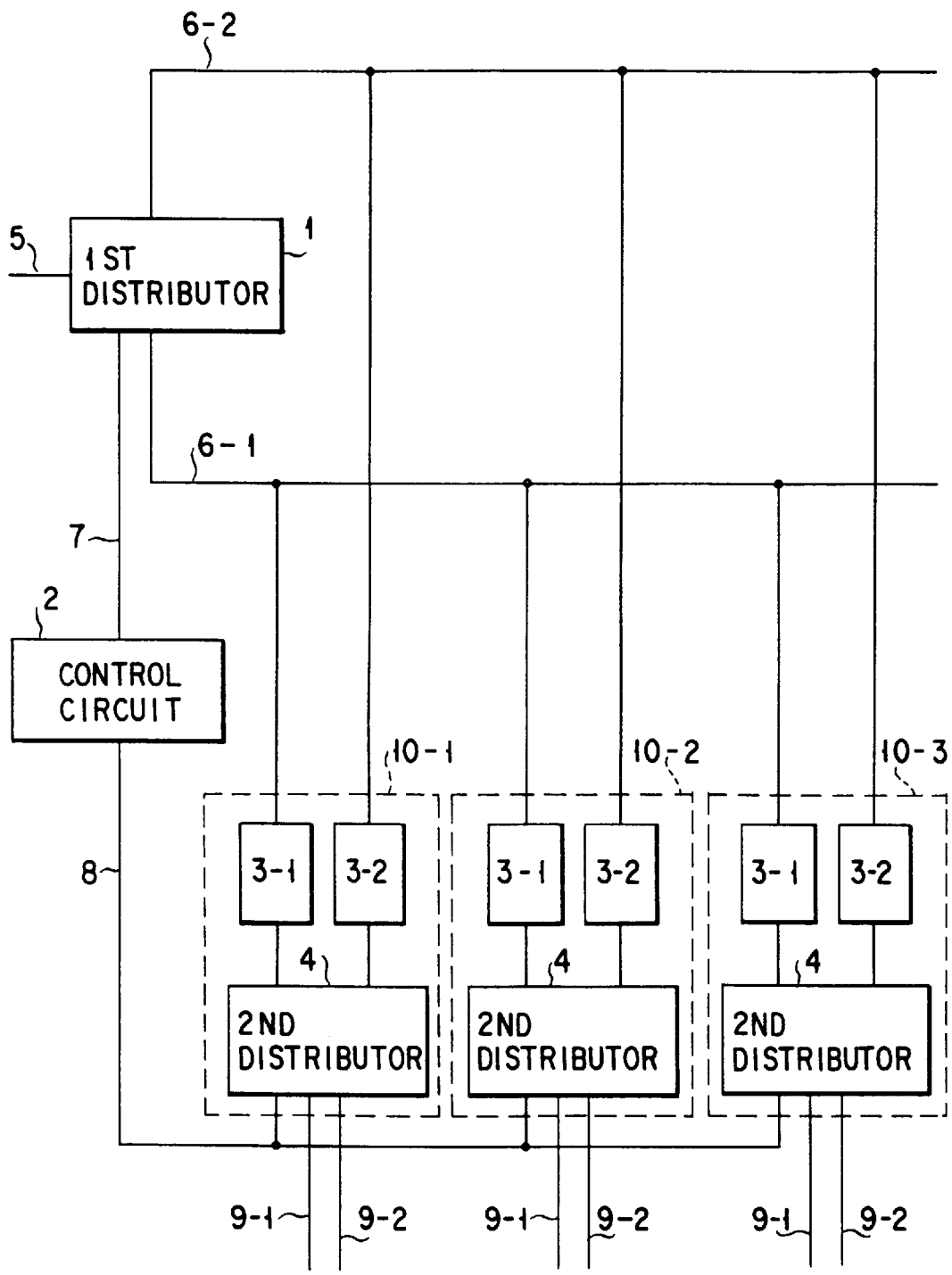
F I G. 3

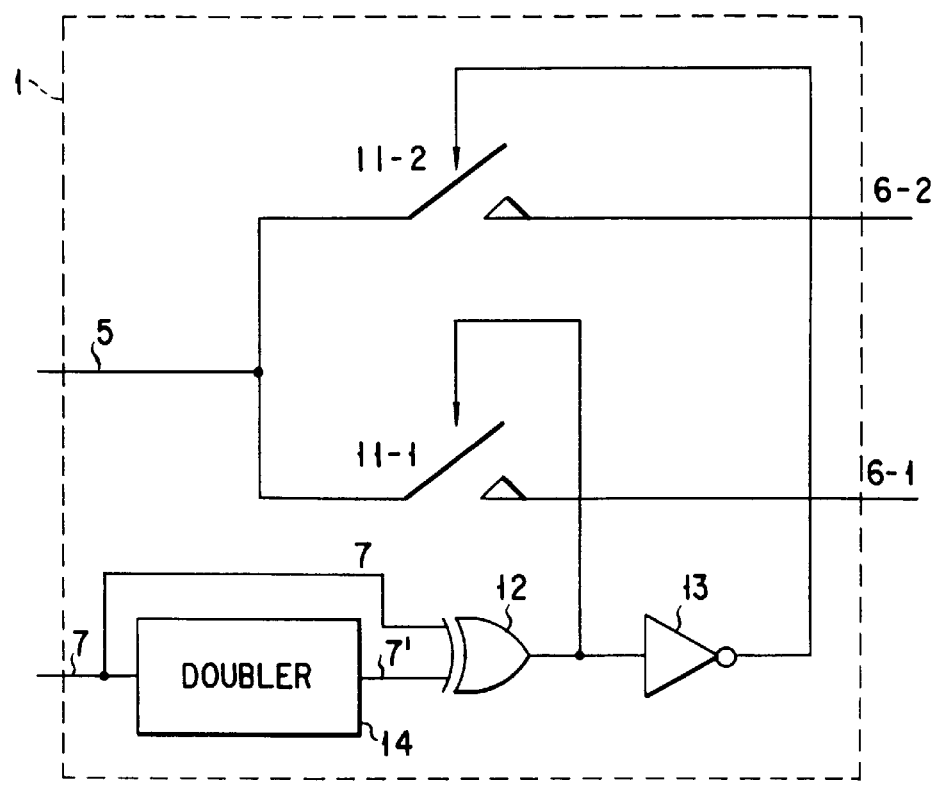
FIG. 6A
FIG. 6B
FIG. 6C
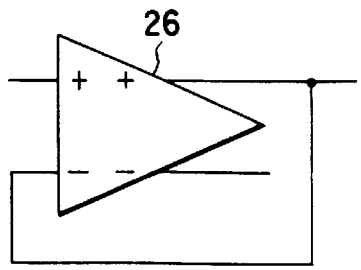
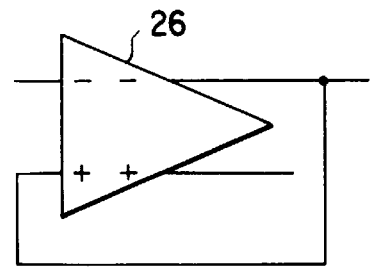
FIG. 12A      FIG. 12B

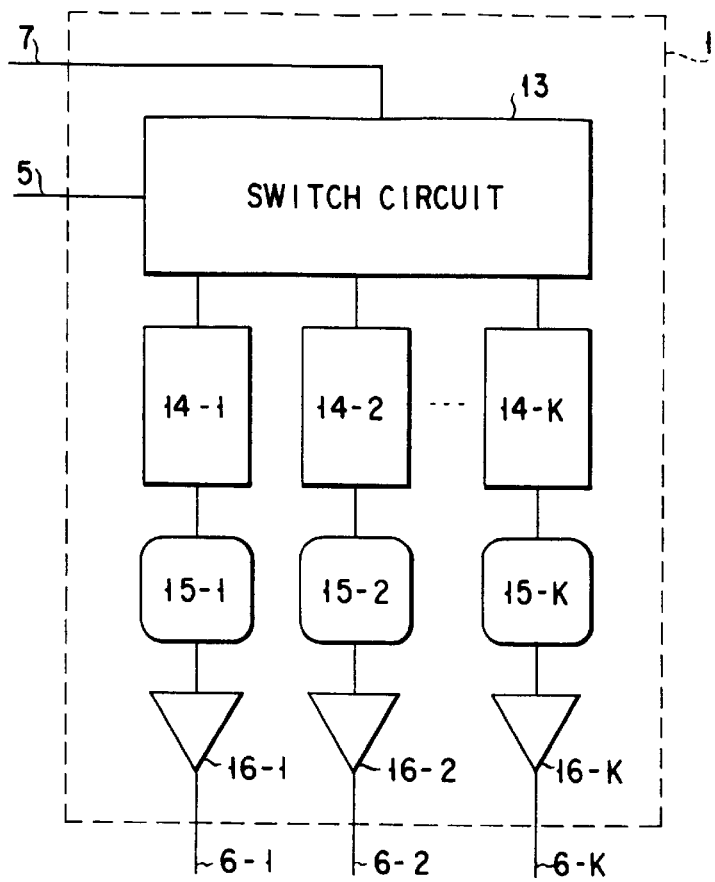
F I G. 8
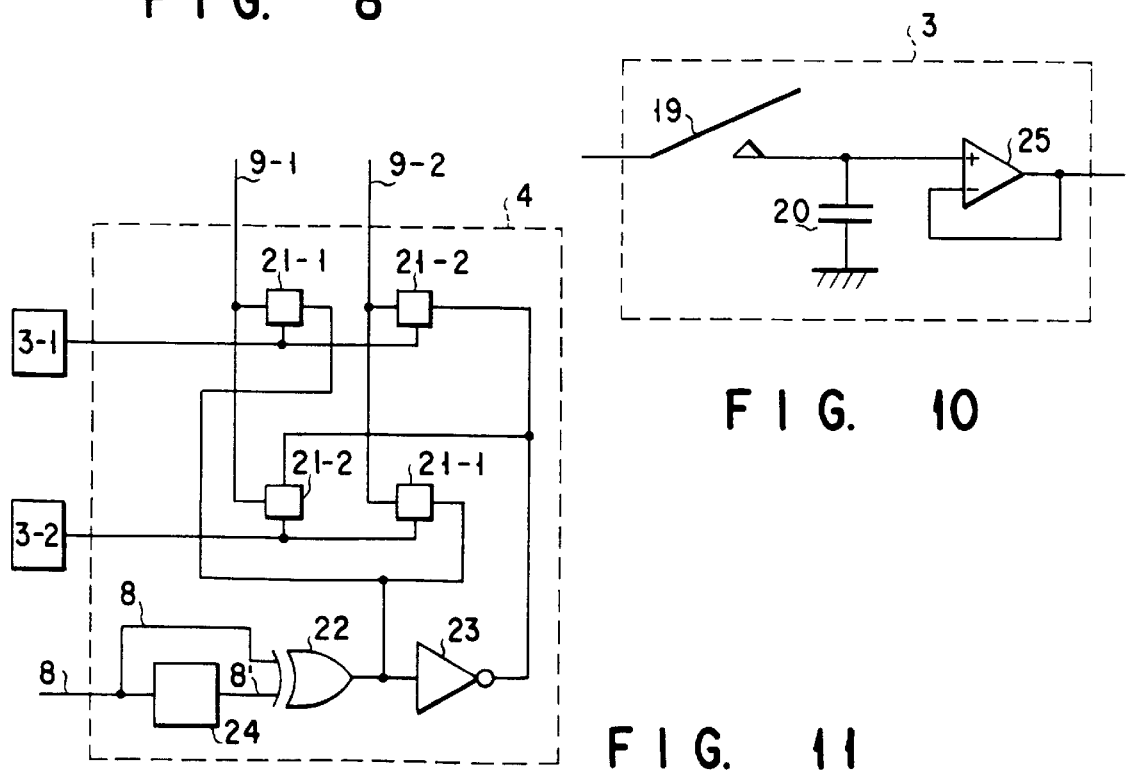
F I G. 10
F I G. 11

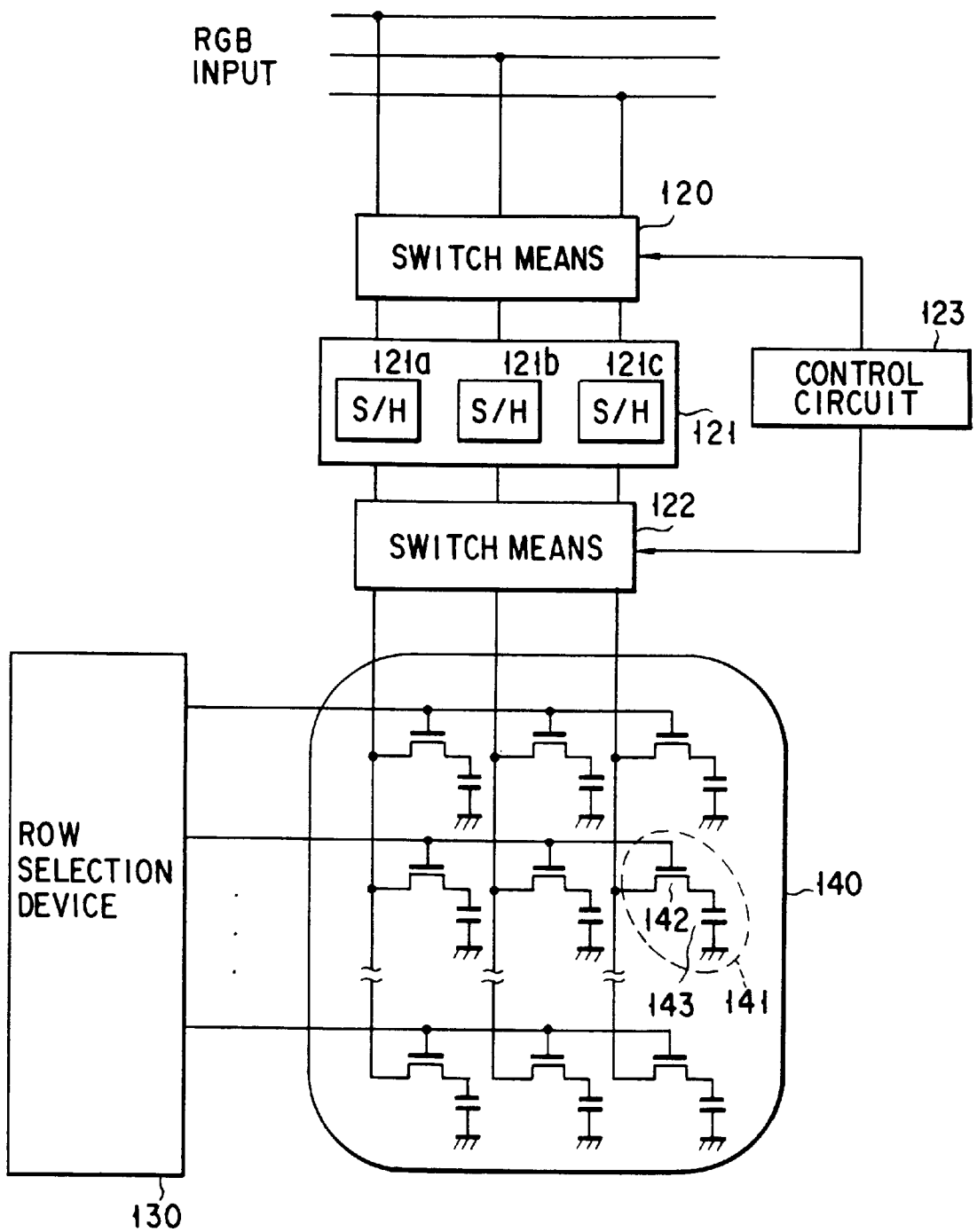
F I G. 15

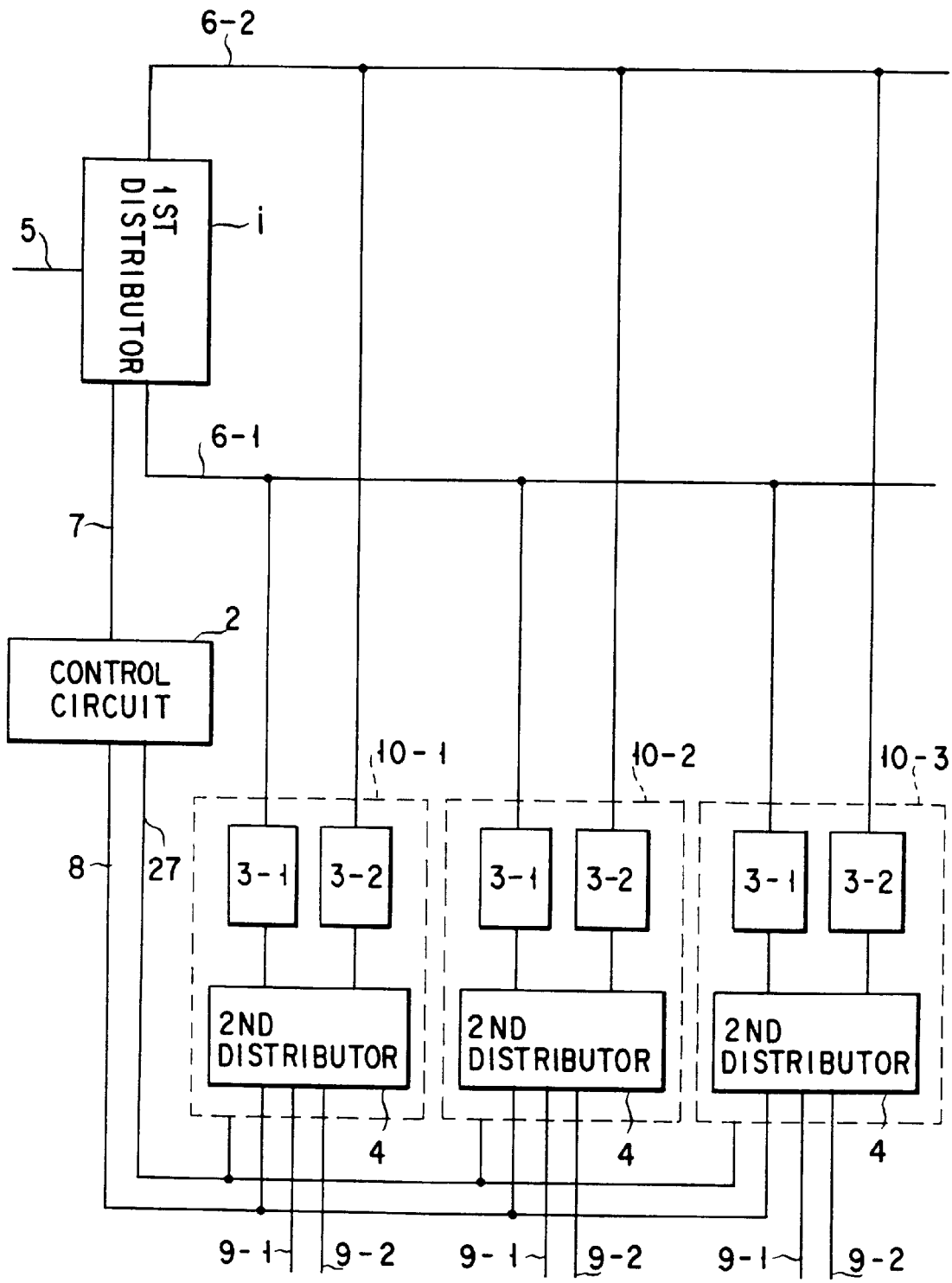
F I G. 16

SIGNAL PROCESSING APPARATUS CAPABLE OF REDUCING CONVERSION ERROR OF A NUMBER OF PARALLEL-ARRANGED SIGNAL CONVERTERS

BACKGROUND OF THE INVENTION

1. Field of the Invention

The present invention relates generally to a signal processing apparatus, and more particularly to a signal processing apparatus capable of reducing a conversion error of a number of signal converters in which a number of circuits with the same construction and function, such as sample/hold circuits for driving a liquid crystal display, are arranged in parallel.

2. Description of the Related Art

Various devices have been made in conventional signal converters in which a number of circuits with the same construction and function are arranged in parallel, in order to reduce a conversion error of the signal converters. For example, various devices have been made in sample/hold circuits for driving a liquid crystal (LC) display, in order to reduce a conversion error arising in each sample/hold circuit.

For example, Jap. Pat. Appln. KOKAI Publication No. 6-54961 ("SAMPLE/HOLD CIRCUIT") and *Proc. of* 1993 *VLSI Circuits Symp.*, pp. 118–119, Kyoto, Japan, May 1993 (A 700-MHz switched capacitor analog waveform sampling circuit) disclose methods in which a conversion error of a signal conversion apparatus comprising a number of such signal converters can be reduced by enhancing the precision of each signal converter.

A method called "dynamic element matching" or its improvements are known as other methods of reducing the conversion error. In these methods, when a plurality of single-functional circuits are combined to achieve one function, for example, when an n-number of current sources are combined to fabricate a D/A converter for expressing an n-number of gradients, one of the n-number of current sources is chosen to express gradient 1. Since any of the sources may be chosen, the probability of choice of one current source is equalized among all the sources. Thereby, errors of the current sources arising in the respective current sources are averaged and reduced to zero in total. Examples of this technique are a D/A conversion apparatus described in Jap. Pat. Appln. No. 4-140223 and a liquid crystal display driving apparatus described in Jap. Pat. Appln. KOKAI No. 2-189579.

The former prior art is useful in reducing the conversion error of the signal conversion apparatus. In the latter prior art, if sample/hold circuits are used to drive the LC display, the number of sample/hold circuits becomes several thousand in general, and large-scale peripheral control circuits are required. Furthermore, the shuffling mechanism of the signal processing devices is not effectively proposed, because the shuffling mechanism produces output noise. Thus, the feasibility of the latter prior art is very low.

SUMMARY OF THE INVENTION

The object of the present invention is to provide a signal processing apparatus capable of reducing a conversion error of a signal converter wherein a number of circuits with the same construction and function are arranged in parallel.

In order to achieve the object, the present invention provides a signal processing apparatus comprising: switching means for switching one input signal to be processed and outputting the switched signal; a plurality of signal processing means each subjecting an input signal to be processed to predetermined signal processing; control means for controlling the switching operation of the switching means so that the switched signal output from the switching means is input to an arbitrary combination of the signal processing means; and synthesizing means for synthesizing outputs from the arbitrary combination of signal processing means and producing one output signal.

This invention also provides a signal processing apparatus comprising: first switching means for switching a plurality of input signals to be processed and outputting the switched signals; a plurality of signal processing means each having the same structure and subjecting an input signal to be processed to predetermined signal processing, each of the signal processing means having an inherent processing error; control means for controlling the switching operation of the first switching means so that the switched signals output from the switching means are input to an arbitrary combination of the signal processing means; second switching means for outputting an arbitrary combination of outputs from the arbitrary combination of signal processing means, on the basis of a control signal from the control means; and synthesizing means for synthesizing the arbitrary combination of outputs from the second switching means, and producing an output signal in which the inherent signal processing errors of the signal processing means have been averaged.

This invention also provides a display apparatus comprising: first switching means for switching a plurality of input signals to be processed and outputting the switched signals; a plurality of signal processing means each having the same structure and subjecting an input signal to be processed to predetermined signal processing, each of the signal processing means having an inherent processing error; control means for controlling the switching operation of the first switching means so that the switched signals output from the switching means are input to an arbitrary combination of the signal processing means; second switching means for outputting an arbitrary combination of outputs from the arbitrary combination of signal processing means, on the basis of a control signal from the control means; and a display unit comprising a plurality of pixels, for performing a predetermined display operation on the basis of the arbitrary combination of outputs from the second switching means.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a view for schematically describing the present invention, showing a signal processing apparatus of a one-input/one-output construction;

FIG. 2 shows a signal processing apparatus of a multi-input/multi-output construction according to an embodiment of the invention;

FIG. 3 shows an embodiment wherein the number Pi (i=1, M) of signal converters in the structure shown in FIG. 2 is equal to the number J of input terminals of the apparatus;

FIG. 6A shows a structure of a first distributor in the embodiment of the invention, and FIGS. 6B and 6C show signal waveforms in the respective parts of the distributor;

FIG. 8 shows still another structure of the first distributor;

FIG. 10 shows a structure of a signal converter in the embodiment of the invention;

FIG. 11 shows the structure of a second distributor in the embodiment of the invention;

FIGS. 12A and 12B show the structure of a part of the signal converter in the embodiment of the invention;

FIG. 15 shows the structure of another embodiment of the invention; and

FIG. 16 shows a modification of the structure shown in FIG. 3.

DETAILED DESCRIPTION OF THE PREFERRED EMBODIMENTS

Figure 4A:
FIGS. 4A to 4F are views for describing an operation of the embodiment of the invention.

Embodiments of the present invention will now be described in detail with reference to the accompanying drawings.

FIG. 1 is a view for generally describing the present invention, and shows a signal processing apparatus of a one-input/one-output construction. In FIG. 1, switch means 50 outputs an input signal to be processed in a switching manner to a signal processing unit 51. This signal processing unit 51 comprises a plurality of signal processing means (P1, . . . , Pn) each having the same structure and subjecting an input signal to be processed to predetermined processing. Each signal processing means has an inherent signal processing error. Control means 52 controls the switching operation of the switch means 50 so that a switched output from the switch means 50 may be input to an arbitrary combination of the signal processing means (P1, . . . , Pn). An output from the arbitrary combination of the signal processing means is synthesized by synthesizing means 53 comprising an integration circuit, etc. Thus, the synthesizing means 53 produces one output signal in which the inherent signal processing errors of the respective signal processing means have been averaged. The output signal from the control means 52 may be a cyclic signal or a random signal, and may be produced by a pseudo-random number generator comprising a flip-flop, etc., or may be obtained successively from an output signal sequence of control means 52 with ROM construction, or may be randomly selected from an output signal sequence of the control means 52 with ROM construction.

FIG. 2 shows the structure of a signal conversion apparatus according to an embodiment of the present invention. The signal conversion apparatus includes a J-number of apparatus input terminals 100, a Q-number of apparatus output terminals 104, and an N-number of signal converters 102 for producing signals in accordance with the input signals from the apparatus input terminals, which signals are to be output from the output terminals 104 to synthesizing means 106.

The N-number of signal converters 102 are separated into an M-number (M≦N) of signal converter groups each comprising a Pi-number of signal converters. Each signal converter group i (i=1, M) has a Pi-number of input terminals connected individually to the J-number of apparatus input terminals and has a Pi-number of output terminals connected individually to the Q-number of apparatus output terminals. The signal conversion apparatus further comprises first switch means (switch means 101) for selecting from the Pi-number of input terminals the input signals to the Pi-number of signal converters 102, and second switch means (switch means 103) for selecting from the Pi-number of output terminals the output signals from the Pi-number of signal converters 102.

The switching manner of the first and second switch means 101 and 103 is one of 1) switching by repetition of a cycle of a Pi-number of times, 2) switching at a combined cycle of predetermined plural cycles, and 3) random switching with no cyclicity.

According to this structure, the number J of apparatus input terminals may not be equal to the number Pi of signal converters. Thus, the number of signal converters in which an averaged error component is generated can be set, irrespective of the number J, and the error components can be canceled by one another to enhance precision. In addition, it is possible to prevent or reduce such a phenomenon from arising, that the error components are displayed on a display image as a fixed pattern.

FIG. 3 shows a structure wherein the number J of apparatus input terminals and the number Pi of signal converters in FIG. 2 are equal to each other. The structure shown in FIG. 3 comprises a first distributor 1 for converting and distributing an input signal 5 in accordance with a first control signal 7 from a control circuit 2 and thus producing a K-number of signals, and a plurality of signal converter groups 10-i (i=1, M) each including a K-number of signal converter pairs 3-1 and 3-2, which receive the K-number of signals, and a second distributor 4 which receives a K-number of outputs from the K-number of paired signal converter 3-1 and 3-2 and outputs a K-number of paired output 9-1 and 9-2 in accordance with a second control signal 8 from the control circuit 2.

Figure 4B:

FIGS. 4A to 4F and FIGS. 5A to 5H are views for describing the operation of the above embodiment. The operation of the circuit shown in FIG. 3 will first be described with reference to FIGS. 4A to 4F. It is supposed that input signals 5 are time-sequential signals A, B, C, D, E and F, as shown in FIG. 4A. It is also supposed that the number M of signal converter groups shown in FIG. 3 is 1, i.e. the converter group 10-1 alone. The control circuit 2 comprises a logical circuit of a flip-flop, etc., and supplies control signals 7 and 8, as shown in FIG. 4B, to the first distributor 1 and second distributor 4 in synchronism with the input signals 5 or autonomously. The first distributor 1 includes a switching circuit for first supplying the input signal 5 to the signal line 6-1 and then supplying the input signal 5 to the signal line 6-2 when the control signal 7 is at logic level "1". The first distributor 1 also includes a switching circuit for first supplying the input signal 5 to the signal line 6-2 and then supplying the input signal 5 to the signal line 6-1 when the control signal 7 is at logic level "0".

The second distributor 4 includes a switching circuit for supplying the output from the signal converter 3-1 to the output signal line 9-1 and supplying the output from the signal converter 3-2 to the output signal line 9-2 when the control signal 8 is at logic level "1", and also includes a switching circuit for supplying the output from the signal converter 3-2 to the output signal line 9-1 and supplying the output from the signal converter 3-1 to the output signal line 9-2 when the control signal 8 is at logic level "0". The time-sequential signals A, B, C, D, E and F supposed to be the input signal 5 appear alternately on the output signal line 9-1, that is, the time-sequential signals A, C and E are obtained. On the other hand, the time-sequential signals A, B, C, D, E and F supposed to be the input signal 5 also appear alternately on the output signal line 9-2, that is, the time-sequential signals B, D and F are obtained.

A technique of supplying input signals 5 alternately to the signal converters 3-1 and 3-2 has already been known as parallel processing technique of reducing a conversion speed in a signal converter. The parallel-processed signals appearing on the output signal lines 9-1 and 9-2 have the following feature. The time-sequential signals A, C and E appearing on the output signal line 9-1 are successively processed such that the signal A is processed through the signal converter 3-1, the signal B is processed through the signal converter 3-2 and the signal C is processed through the signal converter 3-1, and this process is repeated.

As regards the time-sequential signals B, D and F appearing on the output signal line 9-2, the signal B is processed through the signal converter 3-2, the signal D is processed through the signal converter 3-1 and the signal D is processed through the signal converter 3-2, and this process is repeated. It is found, from the viewpoint of the output signal terminal, that the time-sequential signals obtained as output signals are obtained by using all the signal converters in the signal converter group 10.

The present embodiment will now be described in greater detail in the case where the number M of signal converter groups 10-i (i=1, M) is one or more and each signal converter group 10-i (i=1, M) comprises a K-number of signal converters.

Figure 5A:
FIGS. 5A to 5H are views for describing another operation of the embodiment of the invention.
Figure 5B:
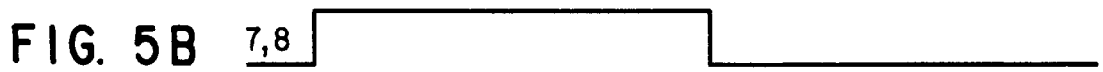
Figure 5C:
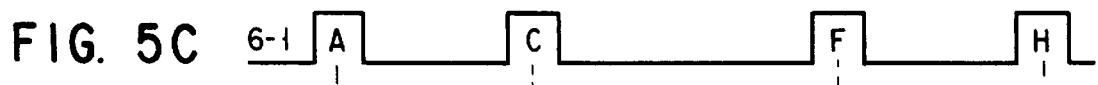
Figure 5D:
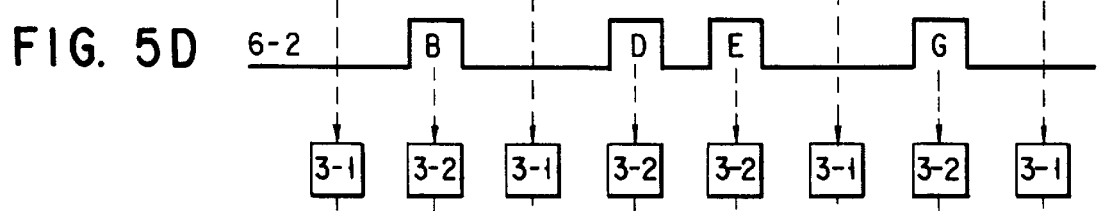

The operation of the circuit shown in FIG. 3 will now be described with reference to FIGS. 5A to 5H. As is shown in FIG. 5A, it is supposed that timesequential signals A, B, C, D, E, F, G and H are input signals 5, and the number M of signal converter groups in FIG. 3 is two, i.e. converter groups 10-1 and 10-2. The control circuit 2 comprises a logical circuit of a flip-flop, etc., and supplies the control signal 7, as shown in FIG. 5B, to the first distributor 1 and the control signal 8, as shown in FIG. 5B, to the second distributor 4 in synchronism with the input signals 5 or autonomously. The first distributor 1 includes a switching circuit for first supplying the input signal 5 to the signal line 6-1 and then supplying the input signal 5 to the signal line 6-2 when the control signal 7 is at logic level "1". The first distributor 1 also includes a switching circuit for first supplying the input signal 5 to the signal line 6-2 and then supplying the input signal 5 to the signal line 6-1 when the control signal 7 is at logic level "0".

Figure 5E:
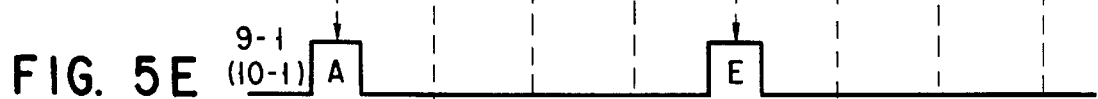
Figure 5F:
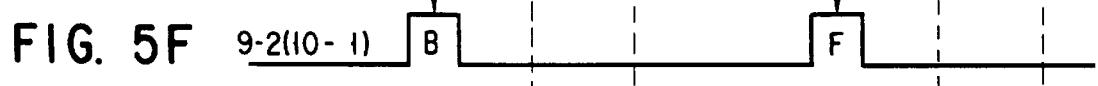

The second distributor 4 includes a switching circuit for supplying the output from the signal converter 3-1 to the output signal line 9-1 in each of the signal converter groups 10-1 and 10-2, and supplying the output from the signal converter 3-2 to the output signal line 9-2 when the control signal 8 is at logic level "1", and also includes a switching circuit for supplying the output from the signal converter 3-2 to the output signal line 9-1 in each of the signal converter groups 10-1 and 10-2 and supplying the output from the signal converter 3-1 to the output signal line 9-2 when the control signal 8 is at logic level "0". Every fifth one of the time-sequential signals A, B, C, D, E, F, G and H supposed to be the input signals 5 appears on the output signal line 9-1 of the signal converter group 10-1, that is, the time-sequential signals A and E are obtained (FIG. 5E). On the other hand, every fifth one of the time-sequential signals A, B, C, D, E, F, G and H supposed to be the input signals 5 also appears on the output signal line 9-2 of the signal converter group 10-1, that is, the time-sequential signals B and F are obtained (FIG. 5F).

Figure 5G:
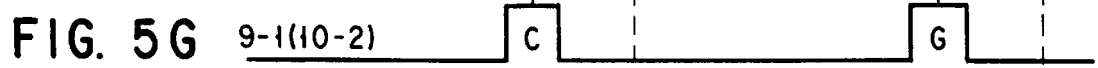
Figure 5H:

Every fifth one of the time-sequential signals A, B, C, D, E, F, G and H supposed to be the input signals 5 appears on the output signal line 9-1 of the signal converter group 10-2, that is, the time-sequential signals C and G are obtained (FIG. 5G). On the other hand, every fifth one of the time-sequential signals A, B, C, D, E, F, G and H supposed to be the input signals 5 also appears on the output signal line 9-2 of the signal converter group 10-2, that is, the time-sequential signals D and H are obtained (FIG. 5H).

As regards the parallel-processed signals appearing on the output signal lines 9-1 and 9-2 of the signal converter group 10-1, the time-sequential signals A and E appearing on the output signal line 9-1 are successively processed such that the signal A is processed through the signal converter 3-1 and the signal B is processed through the signal converter 3-2, and this process is repeated.

The time-sequential signals B and F appearing on the output signal line 9-2 of the signal converter group 10-1 are successively processed such that the signal B is processed through the signal converter 3-2 and the signal F is processed through the signal converter 3-1, and this process is repeated. As regards the parallel-processed signals appearing on the output signal lines 9-1 and 9-2 of the signal converter group 10-2, the time-sequential signals C and G appearing on the output signal line 9-1 are successively processed such that the signal C is processed through the signal converter 3-1 and the signal G is processed through the signal converter 3-2, and this process is repeated.

The time-sequential signals D and H appearing on the output signal line 9-2 of the signal converter group 10-2 are successively processed such that the signal D is processed through the signal converter 3-2 and the signal H is processed through the signal converter 3-1, and this process is repeated. It is found, from the viewpoint of one output signal terminal, that the time-sequential signals obtained as output signals are obtained by using all the signal converters in the signal converter group 10.

The outputs 9-i (i=1, K) obtained after the input signals 5 have been processed are expected signals Vi (i=1, . . . , K) mixed with conversion error signals $e_i$ due to problems in precision, etc. The output signals Vi (i=1, . . . , K) including the conversion error signals $e_i$ are a K-number of random variables. It is supposed that these random variables are independent from one another and each has a Gauss distribution with average E and diffusion σ. This supposition is reasonable since it is considered that the present signal conversion apparatus is achieved by an integrated circuit. Now, as a new random variable, V* expressed by $$V^* = V1 + V2 + \ldots + VK \tag{1}$$

is introduced. If this is an average output, the dispersion of the output deviation of the average output V* is reduced to $\alpha/(K)^{1/2}$. In the embodiments of FIGS. 4A to 4F and 5A to 5H, the average output V* is obtained by paralleling and averaging the signal converters, etc. in K-number of stages. In these examples, since K=2, the dispersion of average output V* is $\alpha/(K)^{1/2}$. As compared to the case where this operation is not performed, the dispersion is reduced to $1/(K)^{1/2}$.

The signal conversion apparatus of the present can be used most advantageously when the output from the apparatus is used as driving voltage to each pixel of the liquid crystal (LC) panel. The reason for this is that the response speed of each pixel of the LC panel is low and energy is accumulated therein, and the processing corresponding to the equation for obtaining the average output V* is performed on the load side. Accordingly, this apparatus is most suitable for driving the load having such an integration function. In a so-called polysilicon TFT (Thin Film Transistor) technique, the LC panel is constructed such that signal conversion apparatuses are integrated on a glass substrate. In general, as compared to a transistor formed of a single crystal silicon, the electrical performance of a transistor formed of a polysilicon is not uniform. Consequently, there is a large deviation between an actual output and a desired output obtained in response to an input by the signal conversion apparatus formed of the latter transistor. Accordingly, a great advantage is obtained by the deviation reducing method of the present invention when this method is applied to the signal conversion apparatus fabricated on the basis of the polysilicon TFT technique.

Figure 4C:
Figure 4D:
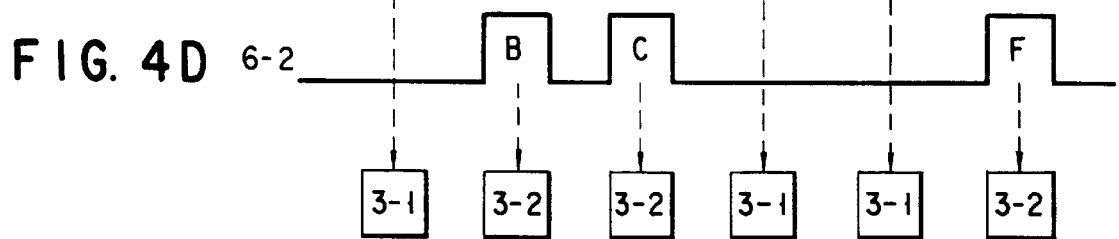
Figure 4E:
Figure 4F:

An embodiment of the first distributor 1 will now be described in detail with reference to FIGS. 6A to 6C, 7 and 8. In FIG. 6A, a control signal 7 (FIG. 6B) is doubled to a control signal 7' (FIG. 6C) by a doubler 14, a control signal for controlling a switch 11-1 is obtained by an exclusive OR circuit 12, and a control signal for controlling a switch 11-2 is obtained by means of an inverter 13. Specifically, when the output of the exclusive OR circuit 12 is at logic "1" level, the switch 11-1 is closed and the switch 11-2 is opened. When the output of the exclusive OR circuit 12 is at logic "0" level, the switch 11-2 is closed and the switch 11-1 is opened. As a result, two outputs 6-1 and 6-2 of the first distributor 1 are produced, as shown in FIGS. 4C and 4D.

Figure 7:
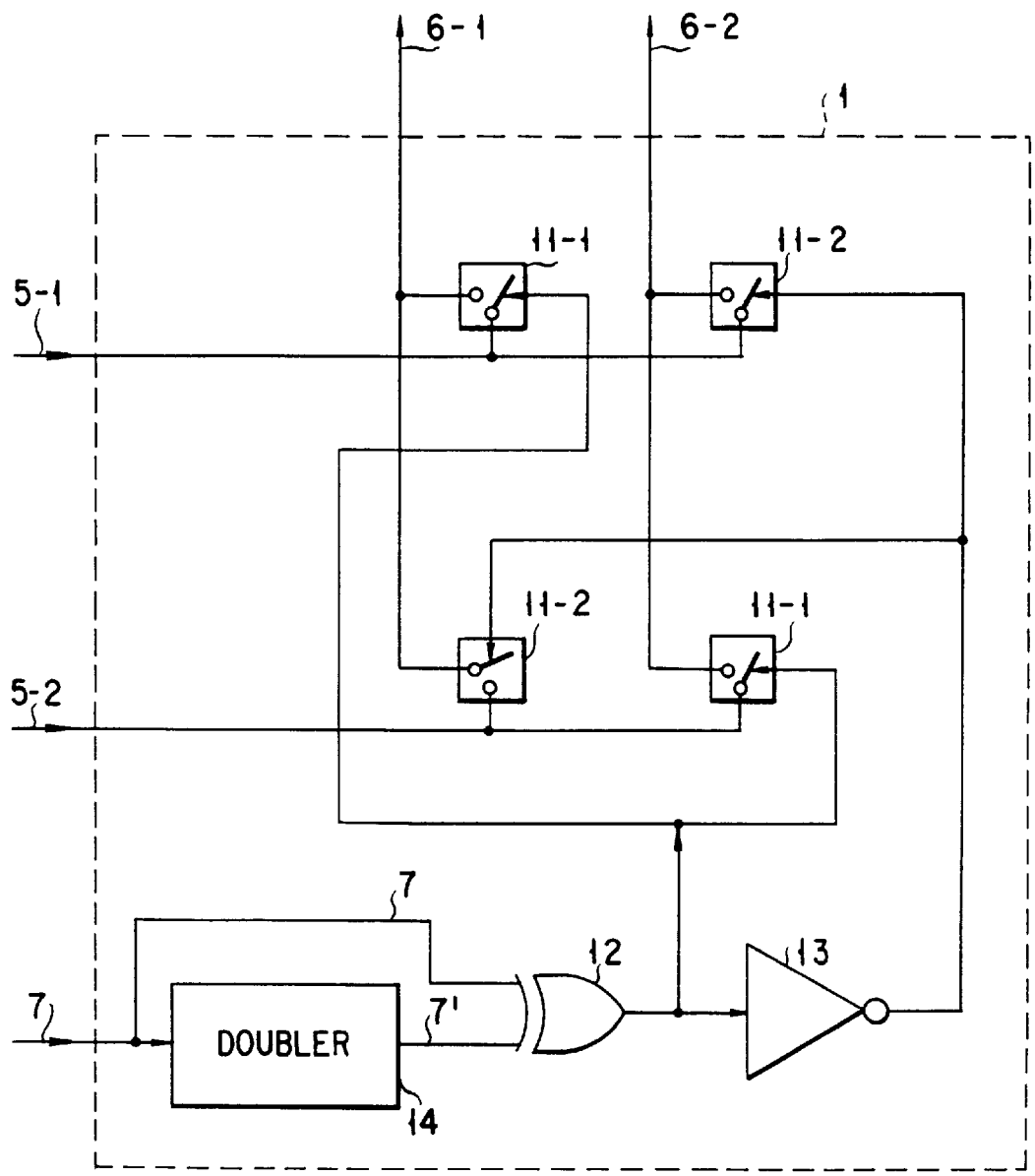
FIG. 7 shows another structure of the first distributor in the embodiment of the invention.

FIG. 7 shows an example of the structure of the first distributor 1 wherein an input signal 5 is already paralleled to input signals 5-1 and 5-2, unlike the preceding embodiments. In FIG. 7, like FIG. 6A, a control signal 7 is doubled to a control signal 7' by a doubler 14. A control signal for controlling a switch 11-1 is obtained by an exclusive OR circuit 12, and a control signal for controlling a switch 11-2 is obtained by means of an inverter 13. Specifically, when the output of the exclusive OR circuit 12 is at logic "1" level, the switch 11-1 is closed and the switch 11-2 is opened. When the output of the exclusive OR circuit 12 is at logic "0" level, the switch 11-2 is closed and the switch 11-1 is opened. As a result, two outputs 6-1 and 6-2 of the first distributor 1 are produced, as shown in FIGS. 4C and 4D.

Figure 9A:
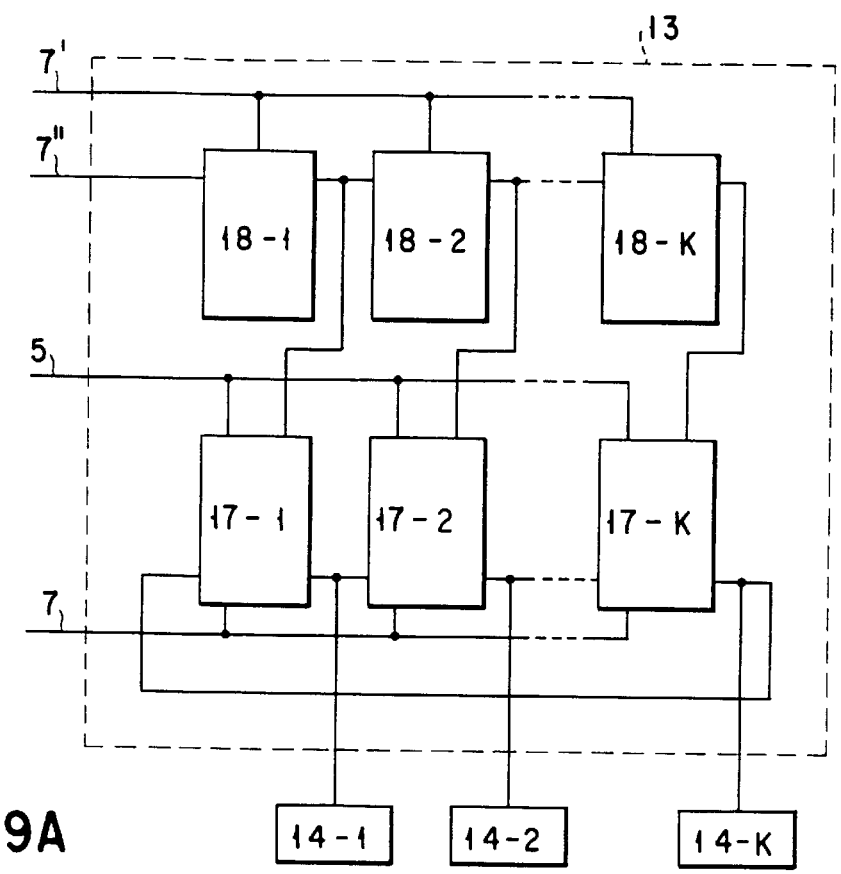
FIG. 9A shows the structure of a part of the first distributor in the embodiment of the invention.
Figure 9B:
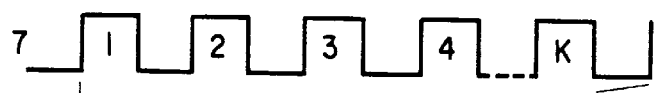
FIGS. 9B, 9C and 9D show waveforms of control signals.
Figure 9C:
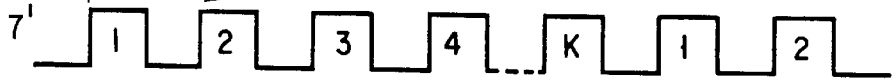
Figure 9D:

Another example of the first distributor 1 will now be described with reference to FIG. 8. In the first distributor shown in FIG. 8, the input signal 5 is a digital data sequence of L-bit length and outputs 6-1, 6-2, . . . , 6-K of the first distributor 1 are analog data. In FIG. 8, reference numeral 13 denotes a switch circuit for determining a specific output terminal from which the L-bit-length digital data sequence supplied as input signal 5 is output. FIG. 9A shows the details of the switch circuit 13. Three control signals 7, 7' and 7", as shown in FIGS. 9B to 9D, are supplied as control signals from the control circuit 2 to the switch circuit 13. The rate of the control signal 7 is equal to that of the L-bit-length digital data sequence of the input signal 5. The control signal 7' is obtained by dividing the control signal 7 by "K". The control signal 7" is a signal obtained by further dividing the control signal 7' by "K", and its pulse width corresponds to one cycle of the control signal 7'.

In FIG. 9A, 1-bit shift registers 18-1, 18-2, 18-K constitute K-stage 1-bit shift registers. The control signal 7' is used as shift clock, the control signal 7" is used as input data, and the input data is output successively from the 1-bit shift registers 18-1, 18-2, . . . , 18-K in accordance with the shift clock of control signal 7'. L-bit shift registers 17-1, 17-2, . . . , 17-K constitute K-stage L-bit shift registers. The control signal 7 is used as shift clock, and the input signal 5 is delivered to the L-bit shift registers 17-1, 17-2, . . . , 17-K as input data. The outputs of the 1-bit shift registers are connected to the data set terminals of the associated L-bit shift registers so that a logic "1" output of the 1-bit shift register is delivered to the L-bit shift register.

Accordingly, the input signal 5 is input to any one of the L-bit shift registers. If one of the L-bit shift registers has received a K-number of input data units, the L-bit shift register which is to receive the input signal 5 is change to another L-bit shift register in accordance with the output from the 1-bit shift register. The K-number of L-bit shift registers are circular-type shift registers, and the input data is transferred successively to the right-hand one in accordance with the shift clock of the control signal 7. The outputs of the L-bit shift registers are stored in the L-bit registers 14-1, 14-2, . . . , 14-K shown in FIG. 8 in accordance with the control signal 7' shown in FIG. 9C as L-bit digital data or shift register values of the switch circuit 13.

In FIG. 8, D/A converters 15-1, 15-2, . . . , 15-K convert the digital values from the shift registers to analog values. In FIG. 8, numerals 16-1, 16-2, . . . , 16-K denote buffers. The outputs from the buffers will become outputs 6-1, 6-2, . . . , 6-K of the first distributor 1. In the embodiment with this structure, since the outputs from the first distributor 1 are analog signals, small-sized analog signal converters can be used as rear-stage signal converters 3-1, 3-2, . . . , 3-K. In this case, the input signal 5 may be subjected in advance to the processing of the switch circuit 13 in FIG. 8. Thereby, the structure of the first distributor 1 can be simplified.

With respect to the embodiment shown in FIG. 3, a more detailed description will now be given of the signal converter groups 10-i (i=1, M) each having K-number of signal converters 3-1 and 3-2 receiving K-number of signals and the second distributor 4 receiving the K-number of outputs from the K-number of signal converters 3-1 and 3-2 and outputting K-number of outputs 9-1 and 9-2 in accordance with the second control signal 8 of the control circuit 2.

FIG. 10 shows an embodiment of each of the signal converters 3-1, 3-2, . . . , 3-K. In FIG. 10, numeral 3 denotes one of the signal converters 3-1, 3-2, . . . , 3-K shown in FIG. 3. Numeral 19 denotes a switch, 20 a capacitor, and 25 a buffer. This circuit configuration is known as that of a sample/hold circuit. In a driver IC for driving an LC panel, etc., several-thousand signal converters are required to process each pixel data in a single horizontal scan period. In general, the switch 19 in this sample/hold circuit is constituted by a MOS transistor. The channel charge accumulated at the turn-on time of the transistor is released to the channel region of the transistor at the turn-off time of the transistor. Thus, a sample potential difference occurs due to the accumulation of charge in the capacitor 20. It is generally known that in the case of an IC, potential errors of many signal converters can be approximated as statistical characteristics by normal distribution, etc. Needless to say, the signal converter is not limited to the sample/hold circuit and may be any device wherein undesirable conversion errors occur during conversion and the errors can be approximated as statistical characteristics by normal distribution, etc.

An example of the structure of the second distributor 4 shown in FIG. 3 will now be described with reference to FIG. 11. The second distributor 4 receives outputs from the signal converters 3-1, 3-2, . . . , 3-K. In FIG. 11, a control signal 8 is doubled by a doubler 24 to produce a control signal 8'. An exclusive OR circuit 22 produces a control signal for controlling a switch 21-1, and an inverter 23 produces a control signal for controlling a switch 21-2. Specifically, when the output from exclusive OR circuit 22 is at logic "1" level, the switch 21-1 is closed and the switch 21-2 is opened. When the output from exclusive OR circuit 22 is at logic "0" level, the switch 21-2 is closed and the switch 21-1 is opened. According to this embodiment, the first distributor 1 is made to perform a distributing operation, while the second distributor 4 is made to perform an inverse distributing operation. The specific procedure in the embodiment shown in FIG. 3 has thus been made clearer.

Figure 13:
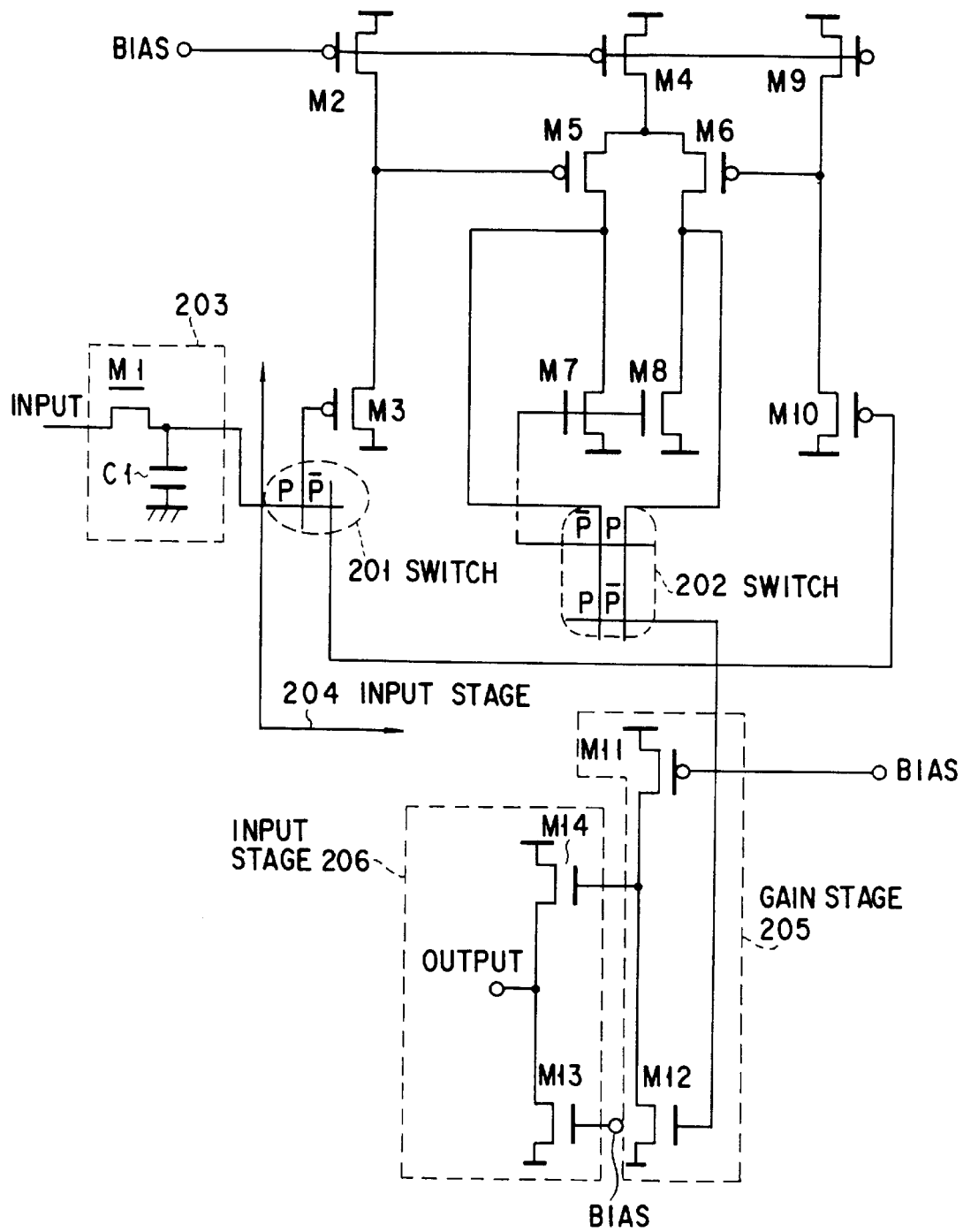
FIG. 13 shows another structure of the signal converter in the embodiment of the invention.

FIGS. 12A, 12B and 13 show the structure of another embodiment wherein signal converters are functional devices. FIGS. 12A and 12B are conceptual views, and FIG. 13 shows the structure embodying the concept. In FIG. 13, in switches 201 and 202, an intersecting portion in a P-state is opened when the control signal is P and an intersecting portion in a $\overline{P}$-state is opened when the control signal is $\overline{P}$.

An input signal is processed by a sample/hold circuit 203 comprising a transistor M1 and a capacitance C1, and the processed signal is input to one input terminal of the functional device via switch 301. Specifically, in the present embodiment, the functional device is an operational amplifier comprising an input stage 204, a gain stage 205 and an output stage 206. The input stage 204 with two input terminals are designed symmetrical. Thus, the other parts are changed over by means of the switches, thereby averaging errors occurring due to design variance in manufacture.

Figure 14A:
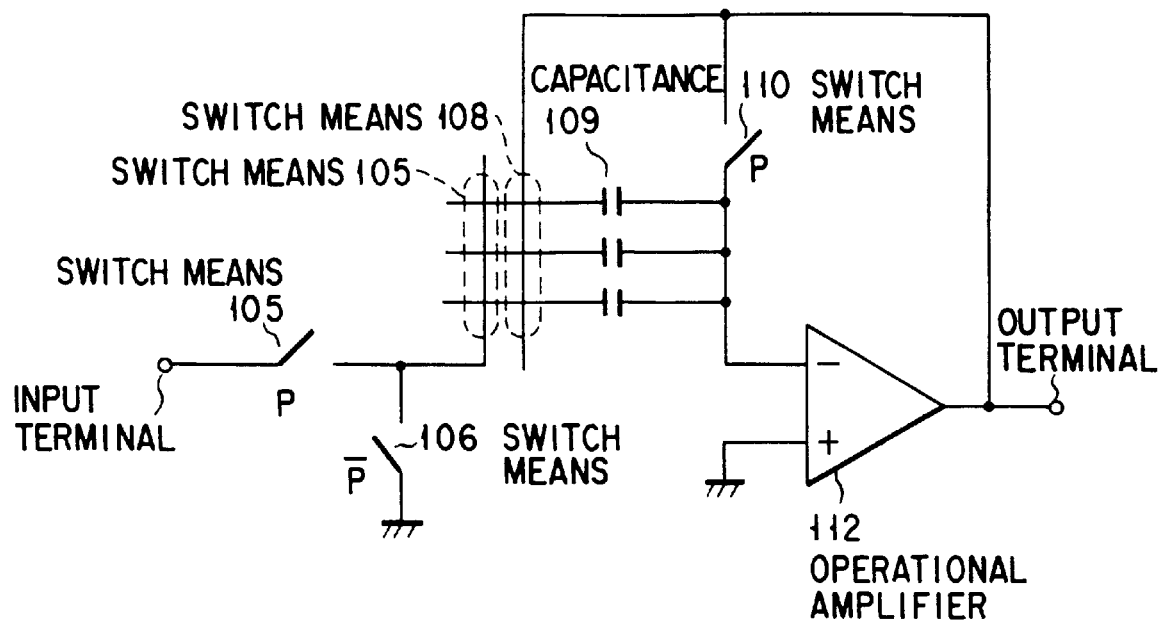
FIGS. 14A and 14B show still another structure of the signal converter in the embodiment of the invention.
Figure 14B:
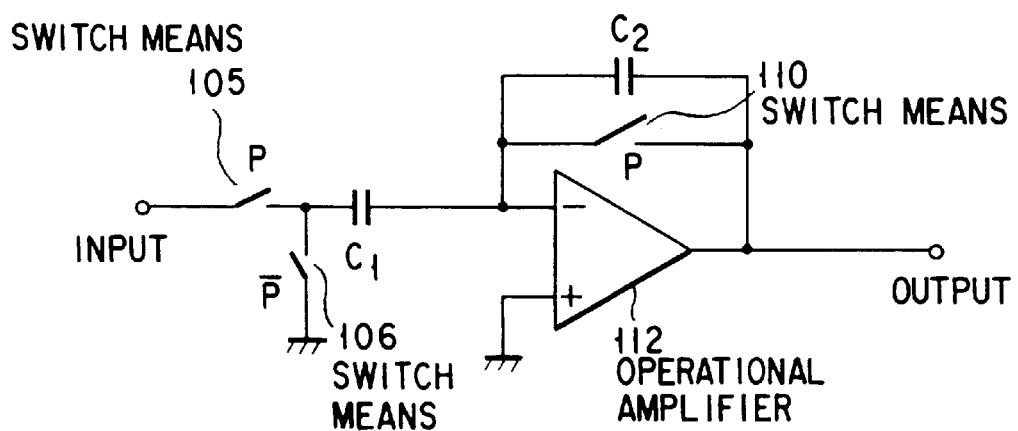

FIGS. 14A and 14B shows the structure of still another embodiment wherein the signal converter is an amplifying functional device. In FIG. 14A, an input signal terminal of the amplifying functional device is connected to one end of each of a plurality of fourth switch means (switch means 107) and one end of a fifth switch means (switch means 106) via a third switch means or switch means 105. The other end of each of the fourth switch means is connected to a positive terminal of each of capacitances 109. The other end of the fifth switch means is grounded. Furthermore, a negative terminal of each of the capacitances 109 is connected to a negative input terminal of an operational amplifier 112. An output terminal of the operational amplifier 112 is connected to the positive terminal of each capacitance 109 via a plurality of sixth switch means (switch means 108) and also connected to the negative input terminal of the operational amplifier 112 via seventh switch means (switch means 110).

With reference to FIG. 14B, the operation of the above structure will now be described. The three switch means 105, 106 and 110 comprise one to be closed when the control signal is P and one to be closed when the control signal is $\overline{P}$. When the control signal is P, the input signal reaches capacitance C1, and one end of C1 is set at input potential Vin. Since the other end of C1 is at 0 V, charge Q1 accumulated in C1 is given by $$Q1 = C1 Vin$$

At this time, the charge of C1 is 0.

When the control signal is $\overline{P}$, the potential of said one end of C1 changes from Vin to 0 V, and the charge of C1 is transferred to C2. Thus, an output signal Vout is given by $$Vout = (C1/C2) \cdot Vin$$

The input signal Vin is amplified by the ratio between C1 and C2.

The operation and advantage of the above-described embodiment will now be described. Suppose that the capacitance values of the three capacitances are Ca, Cb and Cc, respectively. Suppose that the capacitance values Ca and Cb were selected as the capacitance C1 by the switch means 107, and the value Cc was selected as the capacitance C2 by the switch means 108. In this case, the output signal Vout is given by $$Vout = \{(Ca+Cb)/Cc\} \cdot Vin$$

In the case of the present embodiment, the number of possible choices is three. By the operations of the switch means 107 and 108, the following value is obtained:

$$Vout = \frac{1}{3}\left(\frac{Ca+Cb}{Cc} + \frac{Ca+Cc}{Cb} + \frac{Cb+Cc}{Ca}\right) Vin$$

A gain stage with high precision, in which errors can be reduced by averaging, can be obtained.

FIG. 15 shows the structure of a liquid crystal display (LCD) apparatus to which the signal conversion apparatus of this invention is applied. In FIG. 15, switch means 120 and 122, a signal conversion unit 121 comprising sample/hold circuits 121a, 121b and 121c, and a control circuit 123 constitute a signal conversion apparatus of the present embodiment. Numeral 130 denotes a row selection device, and 140 denotes an LC panel device.

Video signals of R, G and B are input to the switch means 120. At this time, the control circuit 123 controls the switching operation of the switch means 120, so that a desired combination of R, G and B signals is input to the signal conversion device. In addition, the control circuit 123 controls the switching operation of the switch means 122 so that a desired combination of outputs from the signal conversion device 121 is input to the LC panel device 140.

The row selection device 130 specifies scan lines through which video signals are supplied to pixels 141 arranged in a matrix within the LC panel device 140, and supplies switching signals to thin film transistors 142 constituting parts of the pixels 141. Thus, the thin film transistors 142 of the specific pixels 141 are driven for a predetermined time period, and electric charge corresponding to the video signals is accumulated in liquid crystals 143.

The present invention is not limited to the above embodiments. In FIG. 10, the buffer 25 itself, which is used for impedance conversion, is a source of error potential due to a deviation of gain, mismatching in the input stage, etc. To solve this problem, in the present embodiment, an operational amplifier 26 having two input terminals (+), (−) and two output terminals (+), (−), as shown in FIGS. 12A and 12B, is used. In addition, as shown in FIG. 16, a control signal 27 is obtained by the control circuit 2 and the two signal converters 3-1 and 3-2 as shown in FIG. 11 are changed over by means of switches, etc., thereby eliminating errors in the buffers 25 by averaging. In this case, the switching of the buffers 25 is controlled by the control signal 27. The control signal 27 is produced on the basis of the control signal 7 or 8.

The function of the first distributor 1 may be performed in advance by external software or hardware at the stage of the input signal 5. Thereby, the manufacturing cost of the signal converters can be reduced. The repetitive control signal of a fixed cycle can be obtained by devising the structure of the filter constituting the delta-sigma converter. Thereby, the influence of the switching by the control signal upon the output load can be reduced.

According to a first aspect of the present invention, the number J of apparatus input terminals may not be equal to the number Pi of signal converters. Thus, the number of signal converters in which error components to be averaged will occur can be set, irrespective of the number J, and the error components can be canceled. Thus, the precision in the output values of the converters can be enhanced.

According to a second aspect of the invention, the dispersion of output deviations of the Pi-number of signal converters can be reduced to a value divided by the square root of Pi or to a lower value.

According to a third aspect of the invention, the dispersion of output deviations of the Pi-number of signal converters can be reduced to a value divided by the square root of Pi. In addition, flickering of an LC display image due to the aforementioned control signal can be reduced.

According to a fourth aspect of the invention, the dispersion of output deviations of the Pi-number of sample/hold circuits can be reduced to a value divided by the square root of Pi or to a lower value.

According to a fifth aspect of the invention, symmetry can be established between the relationship between one of differential inputs of the signal converter and a differential output, and the relationship between the other differential input and the differential output.

According to a sixth aspect of the invention, the input stage with two input terminals is symmetrically constituted. By changing over the other parts by means of switches, errors due to design variance in manufacture can be averaged.

According to a seventh aspect of the invention, the dispersion of output deviations of the Pi-number of signal converters in all the M-number of signal converter groups can be reduced to a value divided by the square root of Pi or a lower value.

According to an eighth aspect of the invention, this invention can be applied to a technique of successively processing the apparatus input signals.

According to a ninth aspect of the invention, the dispersion of deviations outputs produced by converting input signals by means of the K-number of signal converters can be reduced to a value divided by the square root of K.

According to a tenth aspect of the invention, the dispersion of deviations outputs produced by sampling input signals by means of the K-number of sample/hold circuits can be reduced to a value divided by the square root of K.

According to an eleventh aspect of the invention, this invention can be applied to a display signal source of a liquid crystal display apparatus, thereby enhancing the image quality.

As has been described above, according to the present invention, signal processing errors due to various causes can be averaged and canceled by simple additional circuits. As a result, the hardware cost can be reduced and the conversion precision enhanced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A signal processing apparatus comprising:
    switching means for switching an input signal to be processed from a signal path and outputting switched signals along switched signal paths;
    a plurality of signal processing means each performing predetermined signal processing upon the switched signals received from said switching means over said switched signal paths;
    control means for controlling a switching operation of said switching means so that the switched signals output from said switching means are input to an arbitrary combination of said signal processing means over said switched signal paths; and
    synthesizing means for synthesizing outputs from said arbitrary combination of signal processing means and for returning the switched signals arriving over the switched signal paths to the signal path so as to produce one output signal.

2. The signal processing apparatus according to claim 1, wherein a control signal produced by said control means in order to control the switching operation of the switching means includes a cyclic or a combined signal of plural cyclic signals.

3. The signal processing apparatus according to claim 1, wherein a control signal produced by said control means in order to control the switching operation of the switching means includes a random signal.

4. The signal processing apparatus according to claim 1, wherein said plurality of signal processing means includes sample/hold circuits.

5. The signal processing apparatus according to claim 1, wherein said synthesizing means includes an integrating circuit.

6. A signal processing apparatus comprising:
    first switching means for switching a plurality of input signals to be processed and outputting switched signals;
    a plurality of signal processing means each having the same structure and subjecting the switched signals from the switching means to predetermined signal processing, each of said signal processing means having an inherent processing error;
    control means for controlling the switching operation of said first switching means so that the switched signals output from said switching means are input to an arbitrary combination of said signal processing means;
    second switching means for outputting an arbitrary combination of outputs from said arbitrary combination of signal processing means, said second switching means being controlled by a control signal from said control means; and
    synthesizing means for synthesizing said arbitrary combination of outputs from said second switching means and producing an output signal in which the inherent signal processing errors of the signal processing means have been averaged.

7. The signal processing apparatus according to claim 6, wherein the control signal produced by said control means in order to control the switching operations of the first and second switching means includes a cyclic signal.

8. The signal processing apparatus according to claim 6, wherein the control signal produced by said control means in order to control the switching operations of the first and second switching means includes a random signal.

9. The signal processing apparatus according to claim 6, wherein said plurality of signal processing means includes sample/hold circuits.

10. The signal processing apparatus according to claim 6, wherein said synthesizing means includes an integrating circuit.

\* \* \* \* \*